(12) United States Patent
Jeong et al.

(10) Patent No.: US 12,526,987 B2
(45) Date of Patent: Jan. 13, 2026

(54) METHOD OF FABRICATING THE SEMICONDUCTOR MEMORY DEVICE INCLUDING CHANNEL PILLAR

(71) Applicant: SK hynix Inc., Icheon-si (KR)

(72) Inventors: Ki Chang Jeong, Icheon-si (KR); Nam Kuk Kim, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 18/594,365

(22) Filed: Mar. 4, 2024

(65) Prior Publication Data

US 2024/0206160 A1    Jun. 20, 2024

Related U.S. Application Data

(63) Continuation of application No. 17/147,148, filed on Jan. 12, 2021, now Pat. No. 11,937,421.

(30) Foreign Application Priority Data

Sep. 18, 2020 (KR) .................. 10-2020-0120195

(51) Int. Cl.
| H10B 41/27 | (2023.01) |
| H01L 23/522 | (2006.01) |
| H10B 41/10 | (2023.01) |
| H10B 43/10 | (2023.01) |
| H10B 43/27 | (2023.01) |

(52) U.S. Cl.
CPC ......... *H10B 41/27* (2023.02); *H01L 23/5226* (2013.01); *H10B 41/10* (2023.02); *H10B 43/10* (2023.02); *H10B 43/27* (2023.02)

(58) Field of Classification Search
CPC ........ H10B 41/27; H10B 41/10; H10B 43/10; H10B 43/27; H01L 23/5226
See application file for complete search history.

(56) References Cited

U.S. PATENT DOCUMENTS

| 7,241,655 B2 | 7/2007 | Tang et al. |
| 8,343,820 B2 | 1/2013 | Jung |
| 8,507,973 B2 | 8/2013 | Lee |

(Continued)

FOREIGN PATENT DOCUMENTS

| CN | 102646678 A | 8/2012 |
| CN | 109390349 A | 2/2019 |

(Continued)

*Primary Examiner* — Norman D Richards
*Assistant Examiner* — Sean Ayers Winters
(74) *Attorney, Agent, or Firm* — WILLIAM PARK AND ASSOCIATES LTD.

(57) ABSTRACT

Provided is a method of fabricating the semiconductor memory device. A stack layer, which includes sacrificial layers and first insulating interlayers alternately stacked, is formed. The sacrificial layers are positioned at an uppermost layer of the stack layer. A plurality of channel holes are formed through the stack layer. A first channel pillar is formed in each of the channel holes. A mold layer is formed on the stack layer with the first channel pillar. The mold layer includes a mold hole configured to partially expose the first channel pillar. A second channel pillar is formed in the mold hole. The mold layer and the sacrificial layer at the uppermost layer of the stack layer are then removed.

12 Claims, 19 Drawing Sheets

(56) References Cited

U.S. PATENT DOCUMENTS

| | | |
|---|---|---|
| 8,735,967 B2 | 5/2014 | Lim et al. |
| 8,936,960 B1 | 1/2015 | Wang et al. |
| 9,054,194 B2 * | 6/2015 | Tung .................. H01L 29/66803 |
| 9,269,819 B2 | 2/2016 | Lee |
| 9,601,586 B1 | 3/2017 | Kittl et al. |
| 9,735,276 B2 | 8/2017 | Tung et al. |
| 9,847,344 B2 | 12/2017 | Jung |
| 9,853,042 B2 | 12/2017 | Kim |
| 10,263,010 B2 | 4/2019 | Choi et al. |
| 10,381,450 B1 | 8/2019 | Yada et al. |
| 10,522,362 B2 | 12/2019 | Kim et al. |
| 10,586,803 B2 | 3/2020 | Mushiga et al. |
| 11,114,320 B2 | 9/2021 | Thareja et al. |
| 11,152,479 B2 | 10/2021 | Thareja et al. |
| 2011/0059595 A1 * | 3/2011 | Jung .................... H10D 30/693 |
| | | 438/587 |
| 2013/0009235 A1 | 1/2013 | Yoo |
| 2015/0243672 A1 * | 8/2015 | Kim .................... H01L 29/7926 |
| | | 257/324 |
| 2015/0380429 A1 | 12/2015 | Lee et al. |
| 2016/0204122 A1 * | 7/2016 | Shoji ....................... H10B 43/50 |
| | | 257/314 |
| 2019/0157290 A1 | 5/2019 | Jhang et al. |
| 2019/0259812 A1 | 8/2019 | Ha |
| 2020/0105778 A1 * | 4/2020 | Zhang ............... H01L 29/40117 |
| 2020/0194441 A1 * | 6/2020 | Kwon .................... H10B 43/27 |

FOREIGN PATENT DOCUMENTS

| | | |
|---|---|---|
| CN | 109496357 A | 3/2019 |
| CN | 111106126 A | 5/2020 |
| CN | 111211132 A | 5/2020 |

* cited by examiner

METHOD OF FABRICATING THE SEMICONDUCTOR MEMORY DEVICE INCLUDING CHANNEL PILLAR

CROSS-REFERENCES TO RELATED APPLICATION

The present application is a continuation application of U.S. patent application Ser. No. 17/147,148, filed on Jan. 12, 2021 claims priority under 35 U.S.C. § 119(a) to Korean application number 10-2020-0120195, filed on Sep. 18, 2020, in the Korean Intellectual Property Office, which is incorporated herein by reference in its entirety.

BACKGROUND

1. Technical Field

Various embodiments may generally relate to an electronic device, more particularly to a semiconductor memory device and a method of manufacturing the semiconductor memory device.

2. Related Art

In order to meet needs of customers such as good performance, low price, etc., it may be required to increase an integration degree of a semiconductor memory device. Because the integration degree of the semiconductor memory device may be an important factor for determining the price of the semiconductor memory device, the increased integration degree may be particularly required.

For example, when the semiconductor memory device may include a plurality of memory cells, the memory cells may be arranged in a three-dimensional structure to reduce an occupying area of the memory cells. A three-dimensional semiconductor memory device including the above-mentioned structure may be developed.

SUMMARY

In an embodiment of the present disclosure, a semiconductor memory device may include a gate stack and a plurality of channel structures. The gate stack may include a plurality of stacked conductive patterns spaced apart from each other. The plurality of the channel structures may be formed through the gate stack. Each of the channel structures may include a first channel pillar, a second channel pillar and a gate insulation layer. The first channel pillar may be formed through the conductive patterns except for an uppermost conductive pattern. The second channel pillar may be formed through the uppermost conductive pattern. The second channel pillar may be configured to make contact with the first channel pillar. The gate insulation layer may be interposed between the uppermost conductive pattern and the first and second channel pillars.

In an embodiment of the present disclosure, a semiconductor memory device may include a gate stack, a plurality of channel structures and a plurality of contact plugs. The gate stack may include a plurality of stacked conductive patterns spaced apart from each other. The plurality of the channel structures may be formed through the gate stack. The plurality of the contact plugs may be formed on the gate stack. The plurality of the contact plugs may be overlapped with the plurality of channel structures respectively. Each of the channel structures may include a first channel pillar, a memory layer, a second channel pillar and a gate insulation layer. The first channel pillar may be formed through a part of the conductive patterns. The memory layer may be configured to surround a bottom surface and a side surface of the first channel pillar. The second channel pillar may be extended from an upper surface of the first channel pillar. The second channel pillar may be formed through a remaining conductive pattern except for the part of the conductive patterns. The second channel pillar may be connected to the contact plug. The gate insulation layer may be configured to surround a side surface of the second channel pillar.

In an embodiment of the present disclosure, according to a method of manufacturing a semiconductor memory device, a stack layer, which may include sacrificial layers and first insulating interlayers alternately stacked, may be formed. The sacrificial layers may be positioned at an uppermost layer of the stack layer. A plurality of channel holes may be formed through the stack layer. A first channel pillar may be formed in each of the channel holes. A mold layer may be formed on the stack layer with the first channel pillar. The mold layer may include a mold hole configured to partially expose the first channel pillar. A second channel pillar may be formed in the mold hole. The mold layer and the sacrificial layer at the uppermost layer of the stack layer may then be removed.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Figure 1:
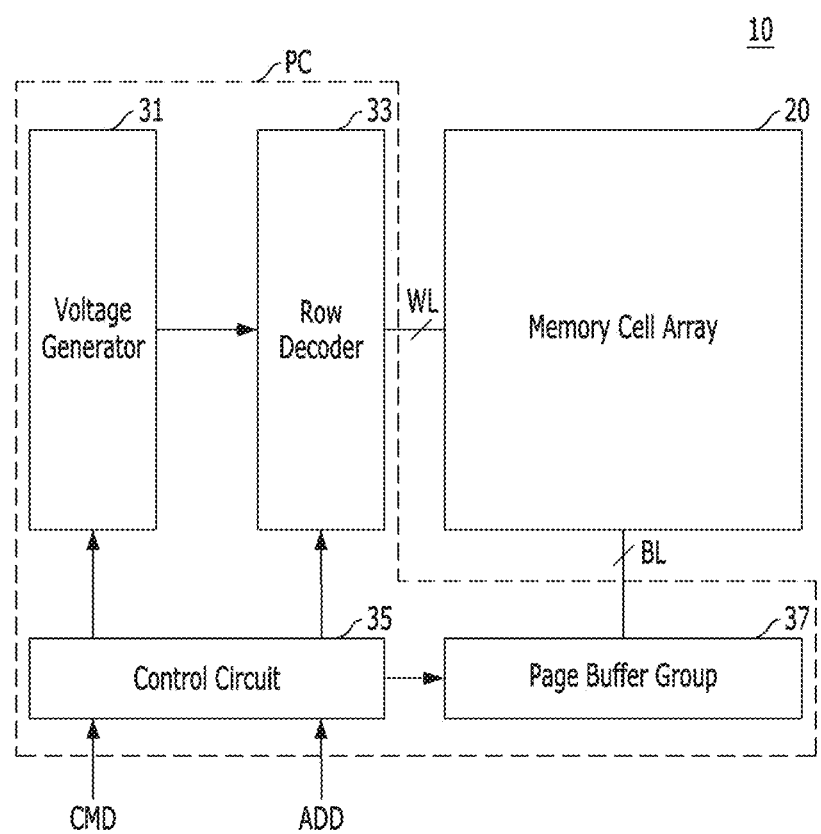
FIG. 1 is a block diagram illustrating a semiconductor memory device in accordance with various examples of embodiments.

Various embodiments will be described with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The embodiments are described herein with reference to cross-section and/or plan illustrations of idealized embodiments of the present disclosure. However, embodiments should not be construed as limiting the concepts. Although a few embodiments will be shown and described, it will be appreciated by those of ordinary skill in the art that changes may be made in these embodiments without departing from the principles and spirit of the present disclosure.

Examples of embodiments may provide a semiconductor memory device and a method of manufacturing the semiconductor memory device for improving operational reliability. The semiconductor memory device may include a non-volatile semiconductor memory device having a three-dimensional structure, for example, a three-dimensional NAND.

Hereinafter, the semiconductor memory device of examples of embodiments may be illustrated with reference to drawings. A first direction D1 may indicate an X-direction, a second direction D2 may indicate a Y-direction, and a third direction D3 may indicate a Z-direction.

Examples of embodiments may provide a semiconductor memory device having improved operational reliability.

Examples of embodiments may also provide a method of manufacturing the above-mentioned semiconductor memory device.

According to an embodiment, the second channel pillar may be used as a channel of a drain selection transistor. Thus, because dummy channel structures might not be required, a chip size in a horizontal direction may be decreased.

Further, by providing the second channel pillar, only third conductive patterns having a single-layered structure separated from each other at a same level may provide sufficient driving capacity required in the drain selection transistor to improve operational reliability.

Furthermore, the drain selection transistor might not have a multi-layered structure so that the chip size in a vertical direction may be reduced and an area of a pass transistor may also be decreased.

Moreover, the second channel pillar may be formed using the mold layer having the mold hole to readily align the first channel pillar and the second channel pillar with each other so that characteristic deterioration caused by a misalignment between the first channel pillar and the second channel pillar may be fundamentally prevented.

As a result, the semiconductor memory device may have an improved integration degree and improved operational reliability.

FIG. 1 is a block diagram illustrating a semiconductor memory device in accordance with various examples of embodiments.

Referring to FIG. 1, a semiconductor memory device 10 may include a peripheral circuit PC and a memory cell array 20.

The peripheral circuit PC may be configured to control a program operation for storing data in the memory cell array 20, a read operation for outputting the data from the memory cell array 20, and an erase operation for erasing the data in the memory cell array 20. For example, the peripheral circuit PC may include a voltage generator 31, a row decoder 33, a control circuit 35 and a page buffer group 37.

The memory cell array 20 may include a plurality of memory blocks. The memory cell array 20 may be connected with the row decoder 33 through word lines WL. The memory cell array 20 may be connected with the page buffer group 37 through bit lines BL.

The control circuit 35 may be configured to control the peripheral circuit PC in response to a command CMD and an address ADD.

The voltage generator 31 may be configured to generate various operational voltages including a free erase voltage, an erase voltage, a ground voltage, a program voltage, a verification voltage, a pass voltage, a read voltage, etc., used for the program operation, the read operation and the erase operation in response to controls of the control circuit 35.

The row decoder 33 may be configured to select a memory block in response to the controls of the control circuit 35. The row decoder 33 may be configured to apply the operational voltages to the word lines WL connected to the selected memory block.

The page buffer group 37 may be connected to the memory cell array 20 through the bit lines BL. The page buffer group 37 may be configured to temporarily store data, which may be received from an input/output circuit in the program operation, in response to the controls of the control circuit 35. The page buffer group 37 may sense a voltage or a current of the bit lines BL in the read operation or the verification operation in response to the controls of the control circuit 35. The page buffer group 37 may select the bit lines BL in response to the controls of the control circuit 35.

Viewed from a structure, the memory cell array 20 may be arranged side by side with the peripheral circuit PC. Alternatively, the memory cell array 20 may be partially overlapped with the peripheral circuit PC.

Figure 2:
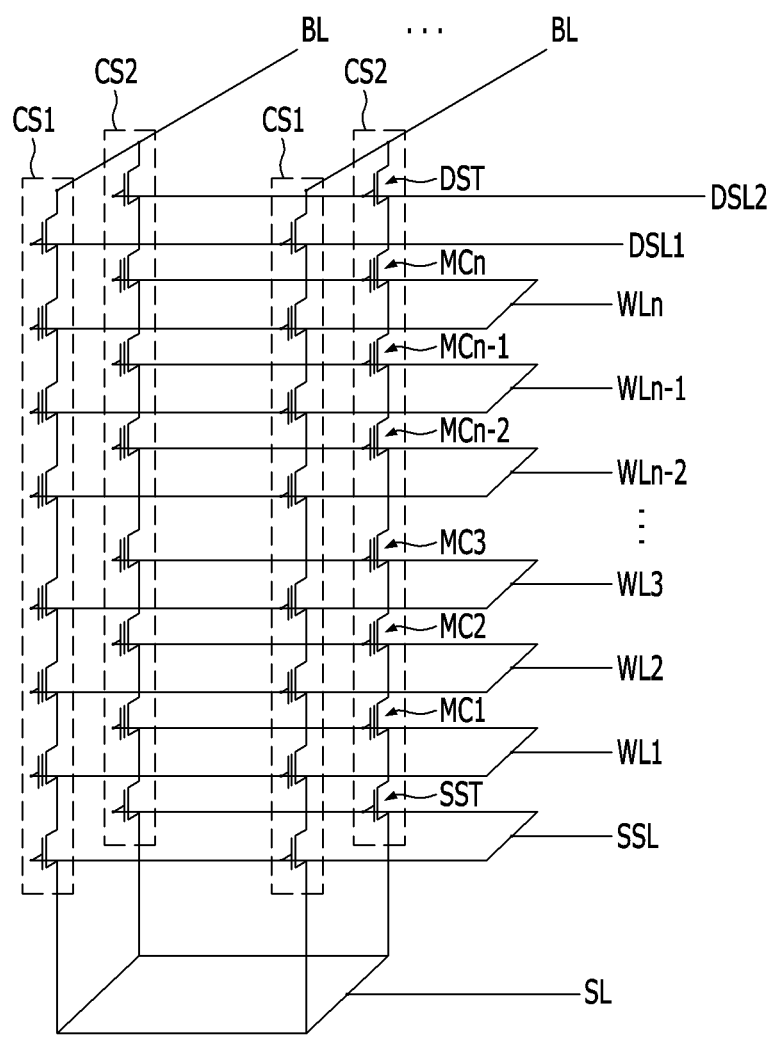
FIG. 2 is a circuit diagram illustrating a memory block of a semiconductor memory device in accordance with various examples of embodiments.

FIG. 2 is a circuit diagram illustrating a memory block of a semiconductor memory device in accordance with various examples of embodiments.

Referring to FIG. 2, a memory block may include a plurality of cell strings CS1 and CS2 commonly connected to a source layer SL and a plurality of word lines WL1~WLn. The cell strings CS1 and CS2 may be connected to a plurality of bit lines BL.

Each of the cell strings CS1 and CS2 may include at least one source selection transistor SST, at least one drain selection transistor DST and a plurality of memory cells MC1~MCn. The source selection transistor SST may be connected to the source layer SL. The drain selection transistor DST may be connected to the bit line BL. The memory cells MC1~MCn may be serially connected between the source selection transistor SST and the drain selection transistor DST.

Gates of the memory cells MC1~MCn may be spaced apart from each other. The gates of the memory cells MC1~MCn may be connected to the stacked word lines WL1~WLn, respectively. The word lines WL1~WLn may be arranged between a source selection line SSL and at least two drain selection lines DSL1 and DSL2. The at least two drain selection lines DSL1 and DSL2 may be spaced apart from each other on a same level.

A gate of the source selection transistor SST may be connected to the source selection line SSL. A gate of the drain selection transistor DST may be connected to a drain selection line corresponding to the gate of the drain selection transistor DST.

The source layer SL may be connected to a source of the source selection transistor SST. A drain of the drain selection transistor DST may be connected to the bit line BL corresponding to the drain of the drain selection transistor DST.

The cell strings CS1 and CS2 may be classified into string groups connected to the at least two drain selection lines DSL1 and DSL2, respectively. The cell strings connected to a same word line and a same bit line may be independently controlled by different drain selection lines. Further, the cell strings connected to a same drain selection line may be independently controlled by different bit lines. For example, the at least two drain selection lines DSL1 and DSL2 may include a first drain selection line DSL1 and a second drain selection line DSL2. The cell strings CS1 and CS2 may include a first group of a first cell string CS1 connected to the first drain selection line DSL1 and a second group of a second cell string CS2 connected to the second drain selection line DSL2.

Figure 3:
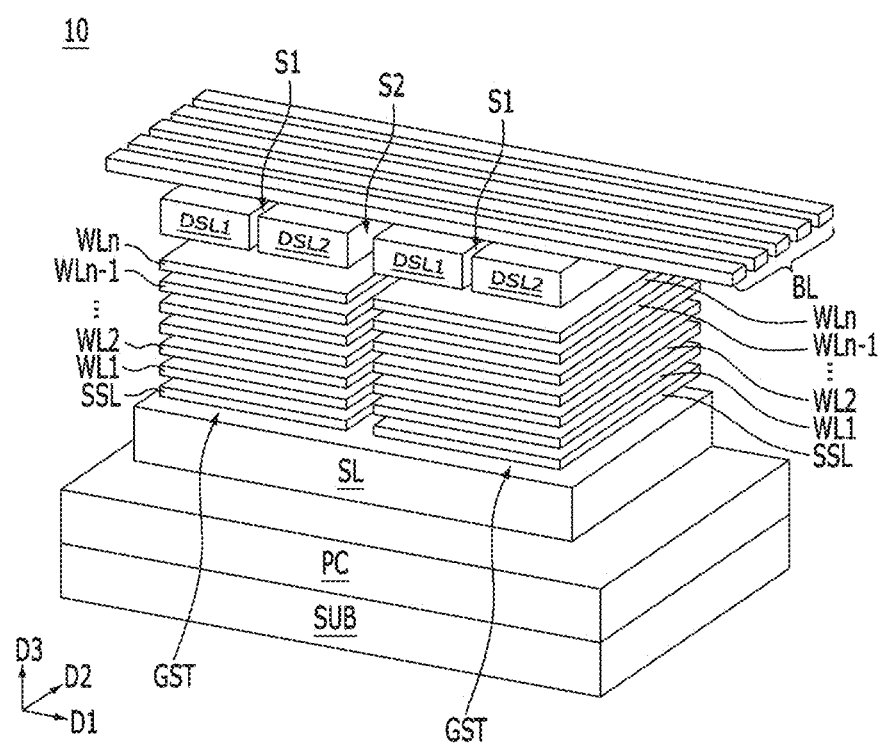
FIG. 3 is a perspective view illustrating a semiconductor memory device in accordance with various examples of embodiments.

FIG. 3 is a perspective view illustrating a semiconductor memory device in accordance with various examples of embodiments.

Referring to FIG. 3, the semiconductor memory device 10 may include the peripheral circuit PC and gate stacks GST. The peripheral circuit PC may be arranged on a substrate SUB. The gate stacks GST may be stacked on the peripheral circuit PC.

Each of the gate stacks GST may include a source selection line SSL, a plurality of word lines WL1~WLn and at least two drain selection lines DSL1 and DSL2. The drain selection lines DSL1 and DSL2 may be divided by a first slit S1 on a same level.

The source selection line SSL and the word lines WL1~WLn may be extended in a first direction D1 and a second direction D2. The source selection line SSL and the word lines WL1~WLn may be arranged on the substrate SUB in a plate shape.

The word lines WL1~WLn may be stacked and spaced apart from each other in a third direction D3. The word lines WL1~WLn may be arranged between the at least two drain selection lines DSL1 and DSL2 and the source selection line SSL.

The gate stacks GST may be divided by a second slit S2. The first slit S1 may have a length in the third direction D3 shorter than a length of the second slit S2. The first slit S1 may be overlapped with the word lines WL1~WLn.

The first slit S1 and the second slit S2 may be extended along the second direction D2 in a straight shape, a zigzag shape, a wave shape, etc. The first slit S1 and the second slit S2 may have variable widths in accordance with design rules.

The source selection line SSL may be positioned closer to the peripheral circuit PC compared to the at least two drain selection lines DSL1 and DSL2. The semiconductor memory device 10 may include the source layer SL arranged between the gate stacks GST and the peripheral circuit PC, and the bit lines BL remote from the peripheral circuit PC compared to the source layer SL. The gate stacks GST may be arranged between the bit lines BL and the source layer SL.

The bit lines BL may include various conductive layers such as a doped semiconductor layer, a metal layer, a metal alloy layer, etc. The source layer SL may include a doped semiconductor layer. For example, the source layer SL may include an n type doped silicon layer.

Although not depicted in drawings, the peripheral circuit PC may be electrically connected with the bit lines BL, the source layer SL and the word lines WL1~WLn via interconnections having various structures.

Figure 4:
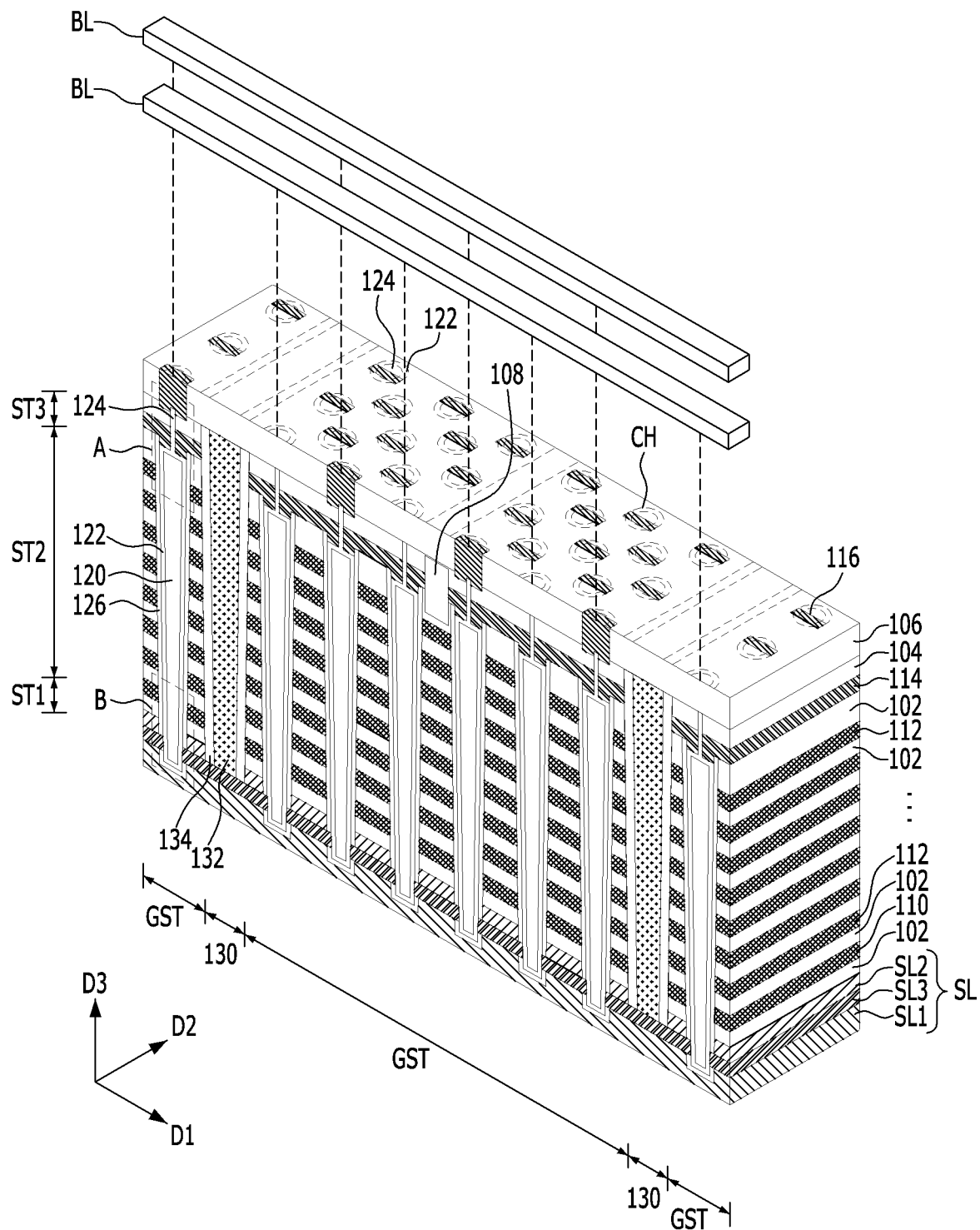
FIG. 4 is a perspective view illustrating a semiconductor memory device in accordance with various examples of embodiments.
Figure 5:
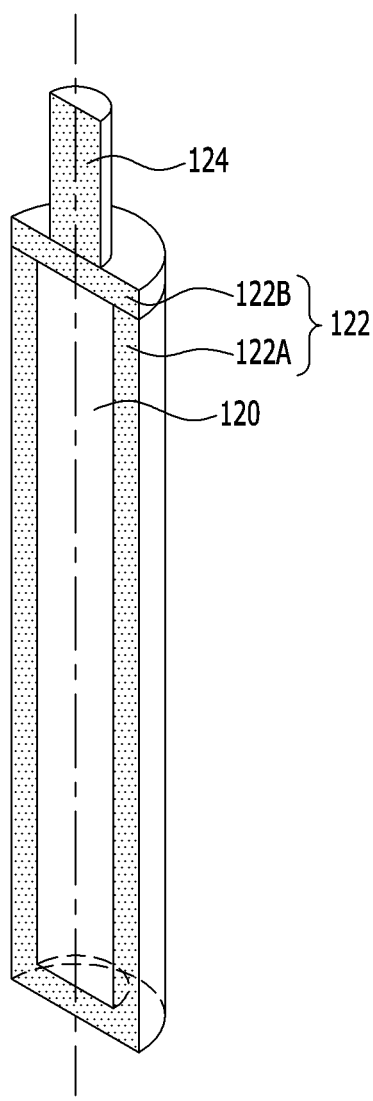
FIG. 5 is a perspective view illustrating a channel pillar of a semiconductor memory device in accordance with various examples of embodiments.
Figure 6:
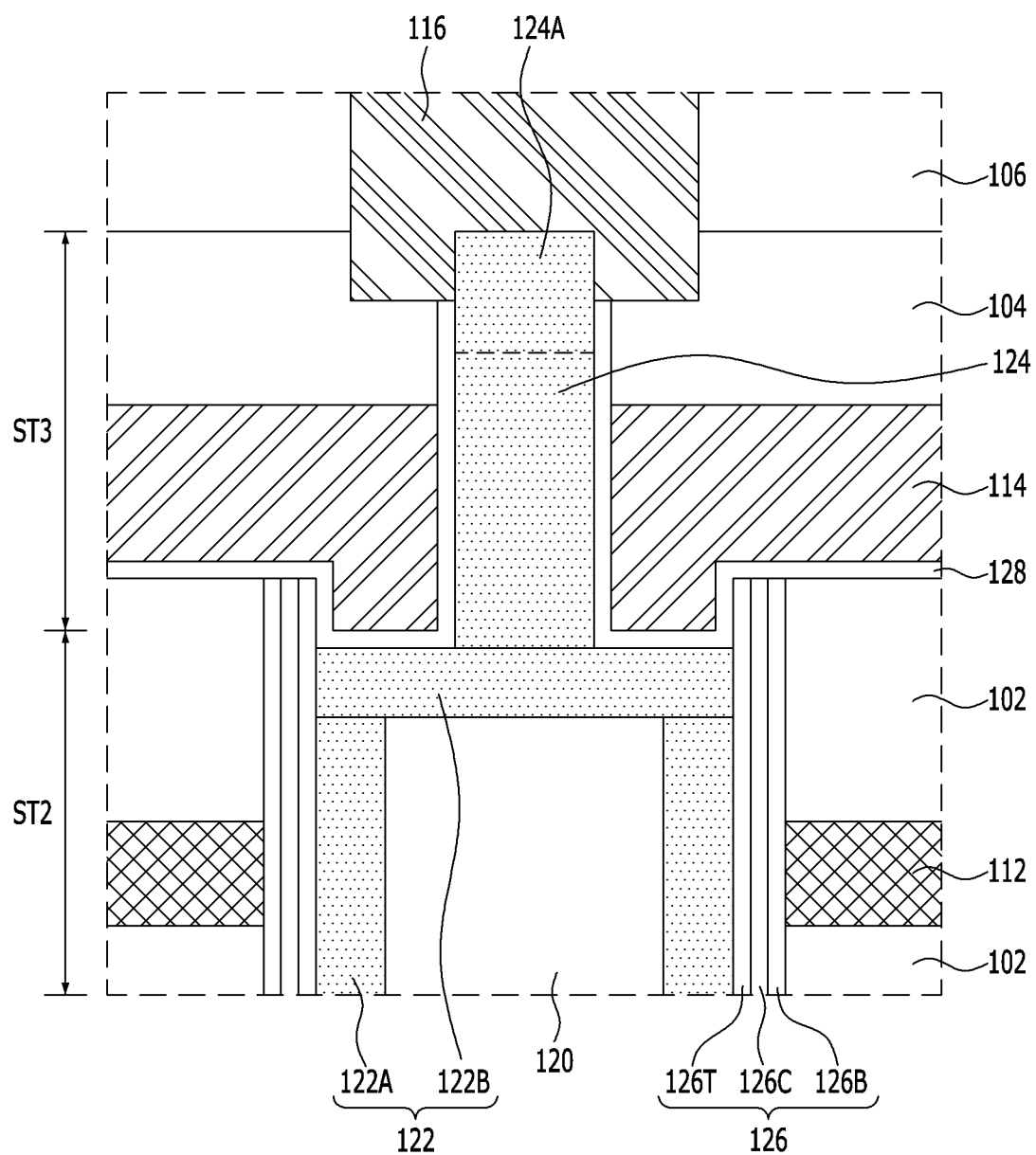
FIG. 6 is an enlarged cross-sectional view of a region "A" in FIG. 4.
Figure 7:
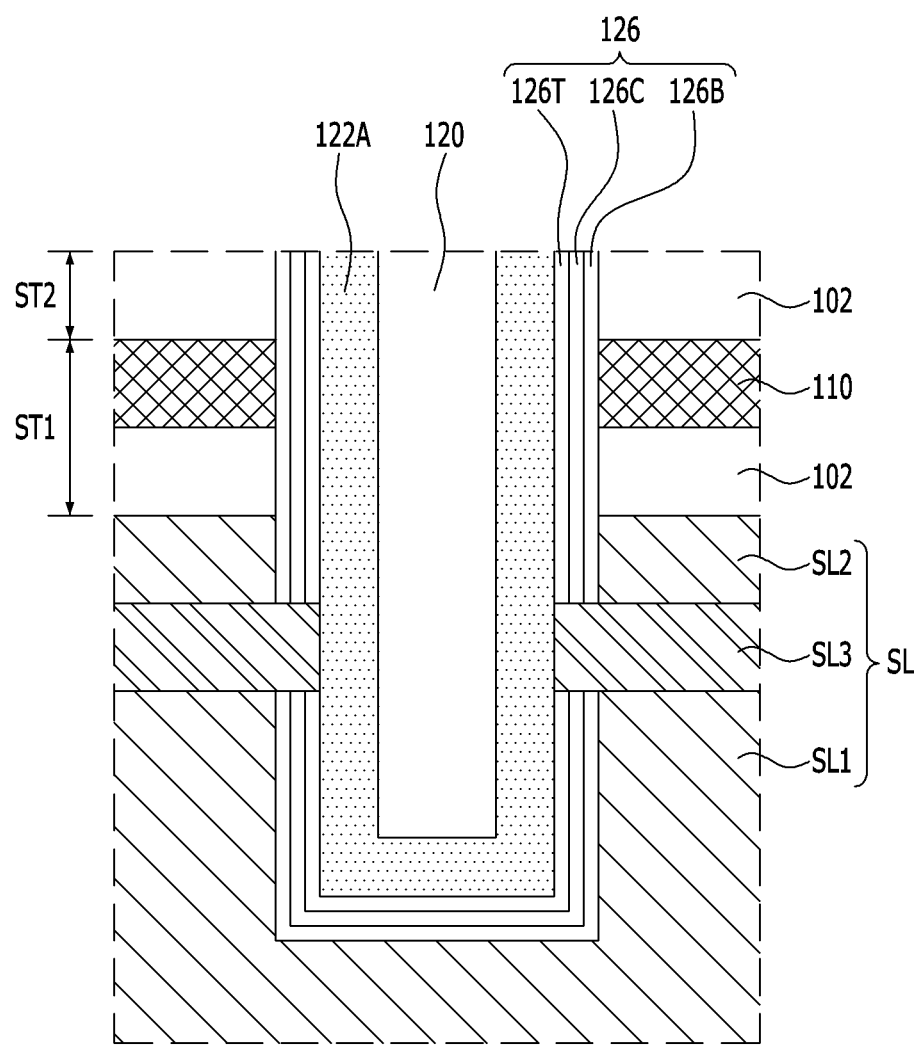
FIG. 7 is an enlarged cross-sectional view of a region "B" in FIG. 4.

FIG. 4 is a perspective view illustrating a semiconductor memory device in accordance with various examples of embodiments, FIG. 5 is a perspective view illustrating a channel pillar of a semiconductor memory device in accordance with various examples of embodiments, FIG. 6 is an enlarged cross-sectional view of a region "A" in FIG. 4, and FIG. 7 is an enlarged cross-sectional view of a region "B" in FIG. 4.

Referring to FIGS. 4 to 7, a semiconductor memory device of various examples of embodiments may include a source layer SL, a plurality of gate stacks GST, slit structures 130, a plurality of channel structures CH and a plurality of contact plugs 116. The gate stacks GST may be formed on the source layer SL. The slit structures 130 may be formed between the gate stacks GST. The channel structures CH may be formed through the gate stacks GST. The contact plugs 116 may be formed on the gate stacks GST. The contact plugs 116 may be electrically connected to the channel structures CH, respectively.

Each of the gate stacks GST may be divided by the slit structures 130. The slit structures 130 may be positioned at both sidewalls of each of the gate stacks GST in the first direction D1. Each of the gate stacks GST divided by the slit structures 130 may correspond to one memory block. The source layer SL may be positioned under the gate stacks GST. The bit lines BL may be positioned over the gate stacks GST. Thus, the source layer SL, the gate stacks GST and the bit lines BL may be overlapped with each other.

In various examples of embodiments, the source layer SL may be positioned over the gate stacks GST and the bit lines BL may be positioned under the gate stacks GST. Alternatively, the bit lines BL may be positioned over the gate stacks GST and the source layer SL may be positioned under the gate stacks GST.

The source layer SL may be overlapped with the gate stacks GST. The source layer SL may have a plate shape extended in the first direction D1 and the second direction D2. The source layer SL may include a first source layer SL1, a second source layer SL2 and a third source layer SL3. The third source layer SL3 may be interposed between the first source layer SL1 and the second source layer SL2. The third source layer SL3 may be electrically connected to a first channel pillar 122 of each of the channel structures CH. The first source layer SL1, the second source layer SL2 and the third source layer SL3 may include doped semiconductor layers. For example, the first source layer SL1, the second source layer SL2 and the third source layer SL3 may include n type doped silicon layers. The third source layer SL3 may have an impurity concentration higher than impurity concentrations of the first and second source layers SL1 and SL2.

In various examples of embodiments, the first source layer SL1, the second source layer SL2 and the third source layer SL3 may include the same conductive material. Alternatively, the first source layer SL1 and the second source layer SL2 may include a same conductive material. The third source layer SL3 interposed between the first source layer SL1 and the second source layer SL2 may include a conductive material different from that of the first and second source layers SL1 and SL2.

The slit structures 130 may correspond to the second slit S2 in FIG. 3. Each of the slit structures 130 may have a linear pattern extended in the second direction D2. Each of the slit structures 130 may be extended in a straight shape, a zigzag shape, a wave shape, etc., in the second direction D2. The slit structure 130 may have a lower portion extended into the source layer SL along the third direction D3. For example, a bottom surface of the slit structure 130 may be configured to make contact with the third source layer SL3 interposed between the first source layer SL1 and the second source layer SL2.

Each of the slit structures 130 may include a slit trench, a slit spacer 134 and a slit layer 132. The slit trench may have a linear shape extended in the second direction. The slit spacer 134 may be formed on both side surfaces of the slit trench in the first direction D1. The slit layer 132 may be formed in the slit trench. The slit spacer 134 may include an insulation material. The slit layer 132 may include a conductive material.

In various examples of embodiments, the slit layer 132 may include the conductive material. Alternatively, the slit layer 132 may include an insulation material.

Each of the gate stacks GST may include a first stack ST1, a second stack ST2 and a third stack ST3 that are sequentially stacked. The first stack ST1 may include a first conductive pattern 110 used as a gate of a source selection transistor and a source selection line. The second stack ST2 may include a plurality of second conductive patterns 112 used as a gate of a memory cell and a word line. The third stack ST3 may include a plurality of third conductive patterns 114 used as a gate of a drain selection transistor and a drain selection line.

Each of the gate stacks GST may include a plurality of stacked conductive patterns. The conductive patterns may be spaced apart from each other. Each of the gate stacks GST may include the conductive patterns and insulating interlayers alternately stacked. Each of the conductive patterns may have a plate shape extended in the first direction D1 and the second direction D2. The conductive patterns may include metal layers. The insulating interlayers may include oxide layers.

The first conductive patterns 110 among the conductive patterns in the first stack ST1, i.e., an lowermost conductive pattern among the conductive patterns of the gate stack GST may be used as the gate of the source selection transistor and the source selection line. The first conductive patterns 110 may correspond to the source selection line SSL in FIG. 3. The first conductive patterns 110 of each of the gate stacks GST may have a single-layered structure. The channel structures CH penetrating the gate stack GST may have a shape configured to penetrate one first conductive pattern 110.

In various examples of embodiments, the first conductive pattern 110 of each of the gate stacks GST may have the single-layered structure used as the gate of the source selection transistor and the source selection line. Alternatively, several conductive patterns positioned in a lower portion of the gate stack GST including the lowermost conductive pattern may also be used as the gate of the source selection transistor and the source selection line.

Further, in various examples of embodiments, one first conductive pattern 110 of each of the gate stacks GST may be positioned on the same level. Alternatively, at least two conductive patterns 110 of each of the gate stacks GST may be spaced apart from each other on the same level.

The third conductive patterns 114 among the conductive patterns in the third stack ST3, i.e., an uppermost conductive pattern among the conductive patterns of the gate stack GST, which may be divided into at least two conductive patterns on a same level by an isolation layer 108, may be used as the gate of the drain selection transistor and the drain selection line. In an embodiment, an uppermost conductive pattern may be the third conductive pattern 114 as shown in FIG. 4. In an embodiment, when the uppermost conductive pattern is the third conductive pattern 114 as shown in FIG. 4, the remaining conductive patterns (i.e., first and second conductive patterns 110 and 112) are below the third conductive pattern 114 in the third direction D3 and may be located in either the first or second stacks ST1 and ST2 of the gate stack GST. The third conductive patterns 114 of each of the gate stacks GST may have a single-layered structure. The channel structures CH may penetrate the third conductive patterns 114. Numbers of the channel structures CH penetrating the third conductive patterns 114 may be same. The isolation layer 108 configured to electrically isolate the third conductive patterns 114 from each other may correspond to the first slit S1 in FIG. 3. Portions of each of the third conductive patterns 114 positioned at one end and the other end of the isolation layer 108 in the first direction D1 may correspond to the first drain selection line DSL1 and the second drain selection line DSL2 in FIG. 3. The isolation layer 108 may include an insulation layer. For example, the isolation layer 108 may include an oxide layer.

Each of the third conductive patterns 114 may have a plate shape. Each of the third conductive patterns 114 may be downwardly protruded from a region of the third conductive pattern 114 overlapped with the channel structures CH. The downwardly protruded portion of the third conductive pattern 114 may be configured to make contact with a gate insulation layer 128 on the first channel pillar 122. Thus, a length of the second channel pillar 124 in the third direction D3 might not be increased. Further, a channel length of the drain selection transistor may be increased to improve driving capacity.

In various examples of embodiments, each of the gate stacks GST may include the two third conductive patterns 114 spaced apart from each other on the same level. Alternatively, each of the gate stacks GST may include at least two third conductive patterns 114 spaced apart from each other on the same level. In this case, the gate stack GST may include at least one isolation layer 108. In an embodiment, the isolation layer 108, as shown in FIG. 4, may extend from a first insulating layer 102 and past the third conductive pattern 114. In an embodiment, as shown in FIG. 4, a part of the isolation layer 108 may be positioned between the contact plugs 116.

The second conductive patterns 112 among the conductive patterns in the second stack ST2, i.e., the second conductive patterns 112 between the first conductive pattern 110 and the third conductive patterns 114 may be used as the gate of the memory cells and the word line. The second conductive patterns 112 may correspond to the word lines WL1~WLn in FIG. 3.

The insulating interlayer of each of the gate stacks GST may include first insulating interlayers 102 over or under the first conductive pattern 110 and the second conductive patterns 112, and a second insulating interlayer 104 on the third conductive patterns 114. The first insulating interlayers 102 except for the first insulating interlayer under the third conductive patterns 114 may have substantially the same thickness. The first insulating interlayer 102 under the third conductive patterns 114 may have a thickness greater than that of the remaining first insulating interlayers 102 under the first insulating interlayer 102 that is under the third conductive pattern 114. An upper surface of the second insulating interlayer 104 contacting the third insulating interlayer 106 may be aligned with an upper surface of the slit structure 130 and an upper surface of the isolation layer 108.

The channel structures CH penetrating the gate stack GST may form a plurality of channel rows. The channel structures CH in each of the channel rows may be arranged in a row along an extending direction of the bit lines BL. Each of the bit lines BL may be electrically connected with the channel structures CH via contact plugs 116.

Each of the channel structures CH may be configured to penetrate the gate stack GST. The channel structure CH may have a lower end extended into the source layer SL. Particularly, the lower end of the channel structure CH may be configured to penetrate the second source layer SL2 and the third source layer SL3. A bottom surface of the lower end of the channel structure CH may be positioned in the first source layer SL1.

Each of the channel structures CH may include a core pillar 120, a first channel pillar 122, a memory layer 126, a second channel pillar 124 and a gate insulation layer 128. The first channel pillar 122 may be configured to fully surround the core pillar 120. The memory layer 126 may be configured to surround a side surface and a bottom surface of the first channel pillar 122. The second channel pillar 124 may be formed on the first channel pillar 122. The gate insulation layer 128 may be configured to surround a side surface of the second channel pillar 124.

A planar shape of the core pillar 120 may be a polygonal shape, a circular shape, a tower shape, etc. The core pillar 120 may be configured to penetrate the second conductive patterns 112 and the first conductive pattern 110. The core pillar 120 may include a lower end extended into the source layer SL. The core pillar 120 may include an oxide layer.

The first channel pillar 122 may function to provide the source selection transistors and the memory cells with a channel. The first channel pillar 122 may include a first channel layer 122A configured to surround a side surface and a bottom surface of the core pillar 120, and a second channel layer 122B configured to cover an upper surface of the core pillar 120 and an end of the first channel layer 122A. Thus, the first channel layer 122A may have a cylindrical shape and the second channel layer 122B may have a plate shape. The first channel layer 122A and the second channel layer 122B may include substantially the same material. In an embodiment, the first channel pillar 122, as shown in FIG. 6, may include a first channel layer 122A configured to surround a side surface and a bottom surface of the core pillar 120, and a second channel layer 122B configured to cover an upper surface of the core pillar 120 and an end of the first channel layer 122A.

The second channel pillar 124 may function to provide the drain selection transistor with a channel. Thus, a diameter of the second channel pillar 124 may be determined in accordance with characteristics required in the drain selection transistor. The second channel pillar 124 may be configured to penetrate the third conductive pattern 114. The second channel pillar 124 may be electrically connected to the first channel pillar 122. The diameter of the second channel pillar 124 may be shorter than a diameter of the first channel pillar 122. The diameter of the second channel pillar 124 may be substantially equal to or less than a diameter of the core pillar 120. The second channel pillar 124 may be formed on the second channel layer 122B. A center line of the second channel pillar 124 in a vertical direction may be aligned with a center line of the first channel pillar 122 or the core pillar 120. The center lines of the first channel pillar 122 and the second channel pillar 124 may be indicated by an alternate long and short dash line.

The second channel pillar 124 may include a junction region 124A over the third conductive pattern 114. The junction region 124A may act as the drain of the drain selection transistor. The junction region 124A may be formed by implanting n type impurities into the second channel pillar 124. In an embodiment, the second channel pillar 124, as shown in FIG. 6, may penetrate the uppermost conductive pattern to extend between the uppermost conductive pattern, and the second channel pillar 124 extending past the uppermost conductive pattern may comprise a junction region 124A.

The gate insulation layer 128 configured to surround the side surface of the second channel pillar 124 may be inserted into a region between the second channel pillar 124 and the third conductive pattern 114. The gate insulation layer 128 may be extended to cover an upper surface of the second channel layer 122B. The gate insulation layer 128 may be configured to make contact with a bottom surface of the third conductive pattern 114. Thus, the gate insulation layer 128 may be inserted between the third conductive pattern 114 and structures under the third conductive pattern 114. The gate insulation layer 128 may function to control a material and a stack structure in accordance with characteristics required in the drain selection transistor. The gate insulation layer 128 may include an oxide layer.

The first channel pillar 122 and the second channel pillar 124 may include substantially the same material. For example, the first channel pillar 122 and the second channel pillar 124 may include semiconductor layers. The semiconductor layer may include a silicon layer.

The memory layer 126 may include a blocking layer 126B, a charge-trapping layer 126C and a tunnel insulation layer 126T sequentially stacked. The tunnel insulation layer 126T may be configured to make contact with the first channel layer 122A. The blocking layer 126B may be configured to make contact with the first conductive pattern 110 and the second conductive patterns 112. The tunnel insulation layer 126T and the blocking layer 126B may include oxide layers. The charge-trapping layer 126C may include a nitride layer.

The memory layer 126 may be configured to surround the bottom surface and the side surface of the first channel pillar 122. The memory layer 126 may include an end extended beyond the first channel pillar 122. Thus, the memory layer 126 may have sidewalls facing with and spaced from a sidewall of the second channel pillar 124. The third conductive pattern 114 downwardly protruded from the region of the third conductive pattern 114 overlapped with the channel structure CH and may be configured to bury a space between the extended memory layer 126 and the second channel pillar 124. In an embodiment, the memory layer 126 may include an end extended past the first channel pillar 122 towards the third conductive pattern 114 in the third direction D3 as shown in FIG. 6. In an embodiment, the memory layer 126 may include an end extended past the first channel pillar 122 to provide side walls that are both facing the second channel pillar 124 and are spaced apart from the second channel pillar 124. In an embodiment, a space between the end of the memory layer 126 extended past the first channel pillar 122 and the second channel pillar 124 is filled the third conductive pattern 114 as shown in FIG. 6.

In various examples of embodiments, the memory layer 126 may include the stacked oxide-nitride-oxide (ONO) structure. Alternatively, the memory layer 126 may include other materials and various stack structure in accordance with characteristics required in the semiconductor memory device.

The contact plugs 116 may be formed on the gate stacks GST. The contact plugs 116 may be electrically connected to the channel structures CH. The contact plugs 116 may be connected between the channel structures CH and the bit lines BL. Particularly, the contact plugs 116 may be positioned in the third insulating interlayer 106 on the gate stacks GST. The bit lines BL may be formed on the third insulating interlayer 106.

Each of the contact plugs 116 may be electrically connected with the second channel pillar 124. An upper end of the second channel pillar 124 may be inserted into a lower end of the contact plug 116. Particularly, the second channel pillar 124 may include the junction region 124A in the upper portion of the second channel pillar 124. The junction region 124A may be partially inserted into the lower end of the contact plug 116. By the above-mentioned structure, a contact area between the second channel pillar 124 and the contact plug 116 may be increased to reduce a contact resistance.

When the upper end of the second channel pillar 124 is inserted into the lower end of the contact plug 116, each of the contact plugs 116 may penetrate the third insulating interlayer 106. Further, the lower end of the contact plug 116 may be extended into the second insulating interlayer 104. Therefore, a part of the isolation layer 108 configured to divide the third conductive patterns 114 may be positioned between the contact plugs 116.

According to various examples of embodiments, the semiconductor memory device may include the second channel pillar used as the channel of the drain selection transistor. Thus, the semiconductor memory device might not require dummy channel structures to reduce a chip size in the horizontal direction. Further, only the third conductive patterns having the single-layered structure divided on a same level may provide sufficient driving capacity required in the drain selection transistor to improve operational reliability. Furthermore, the drain selection transistor might not have a multi-layered structure so that the chip size in a vertical direction may be reduced and an area of a pass transistor may also be decreased.

Figure 8:
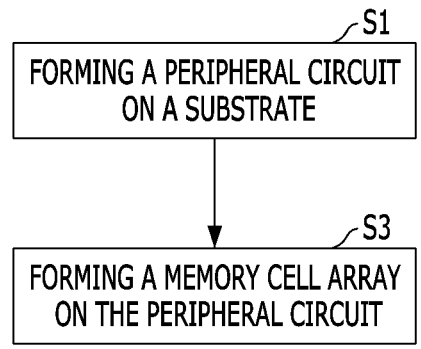
FIG. 8 is a flow chart illustrating a method of manufacturing a semiconductor memory device in accordance with various examples of embodiments.

FIG. 8 is a flow chart illustrating a method of manufacturing a semiconductor memory device in accordance with various examples of embodiments.

Referring to FIG. 8, a method of manufacturing a semiconductor memory device may include forming a peripheral circuit on a substrate in step S1 and forming a memory cell array on the peripheral circuit in step S3.

In step S1, the peripheral circuit may be provided to the substrate. The peripheral circuit may include a plurality of transistors. A source and a drain of each of the transistors may be formed in a region of the substrate. A gate electrode of each of the transistors may be formed on the substrate.

In step S3, the memory cell array may be formed on the peripheral circuit. The step S3 may include forming the source layer SL in FIG. 3, forming the gate stacks GST in FIG. 3, and forming the bit lines BL in FIG. 3.

Although not depicted in drawings, before step S3, conductive patterns for interconnections may be formed on the peripheral circuit and the memory cell array may be formed on the interconnections.

Figure 9:
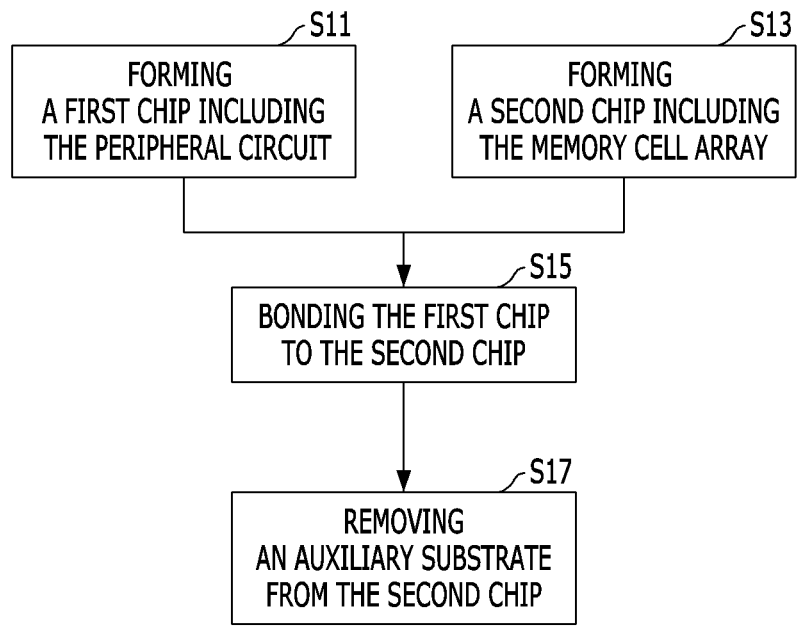
FIG. 9 is a flow chart illustrating a method of manufacturing a semiconductor memory device in accordance with various examples of embodiments.

FIG. 9 is a flow chart illustrating a method of manufacturing a semiconductor memory device in accordance with various examples of embodiments.

Referring to FIG. 9, a method of manufacturing a semiconductor memory device may include forming a first chip including a peripheral circuit in step S11, forming a second chip including a memory cell array in step S13, bonding the first chip to the second chip in step S15, and removing an auxiliary substrate of the second chip in step S17.

In step S11, the peripheral circuit may be provided to a main substrate. The first chip may include first interconnections connected to the peripheral circuit.

In step S13, the memory cell array may be formed on the auxiliary substrate. The step S13 may include forming the source layer SL in FIG. 3, forming the gate stacks GST in FIG. 3, and forming the bit lines BL in FIG. 3. The second chip may include second interconnections connected to the memory cell array.

In various examples of embodiments, the memory cell array in FIG. 3 may include the source layer SL, the gate stacks GST and the bit lines BL sequentially stacked. Alternatively, in step S13, the memory cell array may include the gate stacks on the bit line without the source layer.

In step S15, the second chip may be positioned on the first chip to arrange the first interconnections facing the second interconnections. A part of the first interconnections may be bonded to a part of the second interconnections.

In step S17, the auxiliary substrate may be removed from the second chip to complete the semiconductor memory device including the peripheral circuit and the memory cell array overlapped with each other.

Alternatively, when the memory cell array may include the gate stacks on the bit line without the source layer in step S13, the source layer may be connected to the channel structures after step S17.

FIGS. 10A to 10J are cross-sectional views illustrating a method of manufacturing a semiconductor memory device in accordance with various examples of embodiments. FIGS. 10A to 10J may show a method of manufacturing a memory cell array of the semiconductor memory device. The method of manufacturing the memory cell array may be included in step S3 in FIG. 8 or in step S13 in FIG. 9.

Figure 10A:
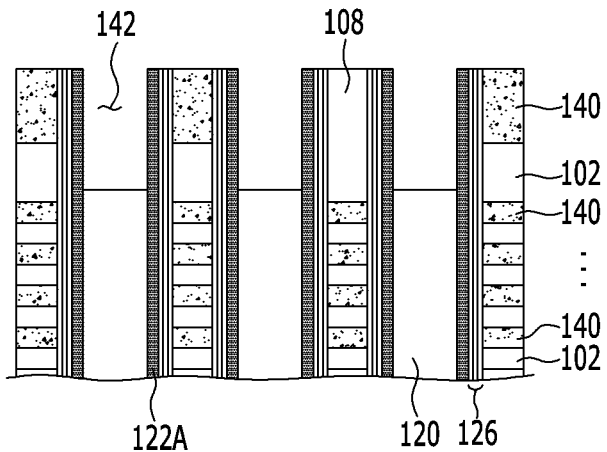
FIGS. 10A, 10B, 10C, 10D, 10E, 10F, 10G, 10H, 10I, and 10J are cross-sectional views illustrating a method of manufacturing a semiconductor memory device in accordance with various examples of embodiments.

Referring to FIG. 10A, a stack layer may be formed on a substrate with a structure. The stack layer may include a first insulating interlayer 102 and a sacrificial layer 140 alternately stacked. The sacrificial layer 140 may be positioned at an uppermost layer of the stack layer. The first insulating interlayer 102 corresponding to an uppermost layer of the first insulating interlayers 102 may have a thickness thicker than a thickness of the remaining first insulating interlayers 102. The sacrificial layer 140 corresponding to the uppermost layer of the sacrificial layers 140 may have a thickness thicker than a thickness of the remaining sacrificial layers 140. The first insulating interlayer 102 may include an oxide layer and the sacrificial layers 140 may include a nitride layer.

An isolation layer 108 may be formed to penetrate the uppermost first insulating interlayer 102 and the uppermost sacrificial layer 140. The isolation layer 108 may correspond to the first slit S1 in FIG. 3. The isolation layer 108 may include an insulation layer. For example, the isolation layer 108 may include an oxide layer.

A plurality of channel holes 142 may be formed through the stack layer using a hard mask pattern.

A memory layer 126 may be formed on a surface of each of the channel holes 142. The memory layer 126 may include a blocking layer 126B, a charge-trapping layer 126C and a tunnel insulation layer 126T sequentially stacked. The blocking layer 126B and the tunnel insulation layer 126T may include an oxide layer and the charger-trapping layer 126C may include a nitride layer.

A first channel layer 122A may be formed on the memory layer 126. The first channel layer 122A on the surface of the channel hole 142 over the memory layer 126 may have a cylindrical shape. The first channel layer 122A may include a semiconductor layer. For example, the first channel layer 122A may include a silicon layer.

A core pillar 120 may be formed on the first channel layer 122A to fully fill the channel hole 142 with the core pillar 120. The core pillar 120 may include an oxide layer.

A recess etch process may be performed on the core pillar 120 on an upper end of the channel hole 142 to reduce a height of the core pillar 120. An etched depth of the recess etch process may be substantially equal to or less than a sum of the thickness of the uppermost first insulating interlayer 102 and the thickness of the uppermost sacrificial layer 140.

Figure 10B:
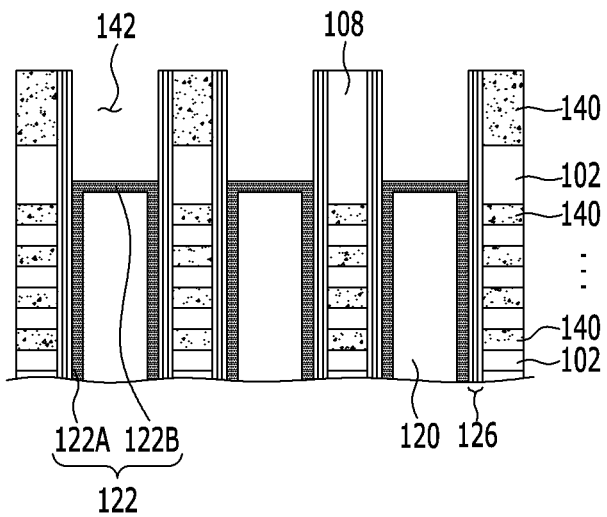

Referring to FIG. 10B, a second channel layer 122B may be formed on the core pillar 120 to cover an end of the first channel layer 122A. The second channel layer 122B may include a material substantially the same as that of the first channel layer 122A. For example, the second channel layer 122B may include a silicon layer. The second channel layer 122B may be formed by forming a silicon layer in the channel hole 142, and by performing a recess etching process on the silicon layer to reduce a thickness of the silicon layer in the channel hole 142. Thus, the second channel layer 122B may have a plate shape having a planar shape corresponding to a planar shape of the channel hole 142.

Therefore, a first channel pillar 122 including the first channel layer 122A and the second channel layer 122B may be formed. The first channel layer 122A may be configured to surround a side surface and a bottom surface of the core pillar 120. The second channel layer 122B may be configured to cover an upper surface of the first channel layer 122A.

After forming the first channel pillar 122, a memory layer 126 exposed through an upper end of the channel hole 142 may be etched.

Figure 10C:
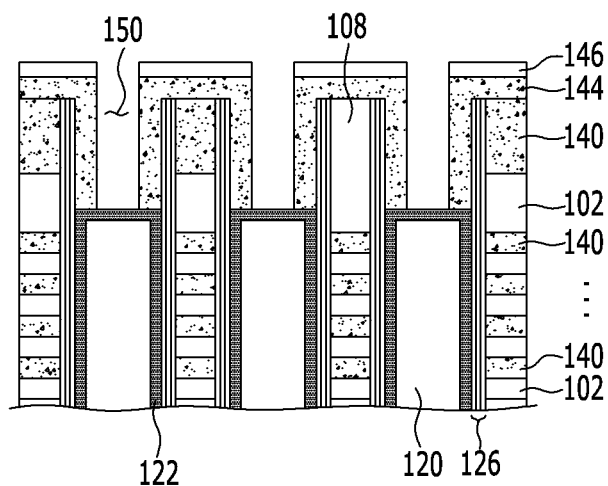

Referring to FIG. 10C, a mold layer 144 may be formed on upper surface of a structure with the first channel pillar 122. The mold layer 144 may include a material substantially the same as that of the sacrificial layer 140. For example, the mold layer 144 may include a nitride layer.

A hard mask may then be formed on the mold layer 144. The mold layer 144 may be etched using the hard mask as an etch barrier to form a mold hole 150 configured to partially expose the second channel layer 122B. Because the mold layer 144 may be extended along a profile of the upper surface of the structure with the first channel pillar 122, the mold hole 150 may be self-aligned with the first channel pillar 122.

Figure 10D:
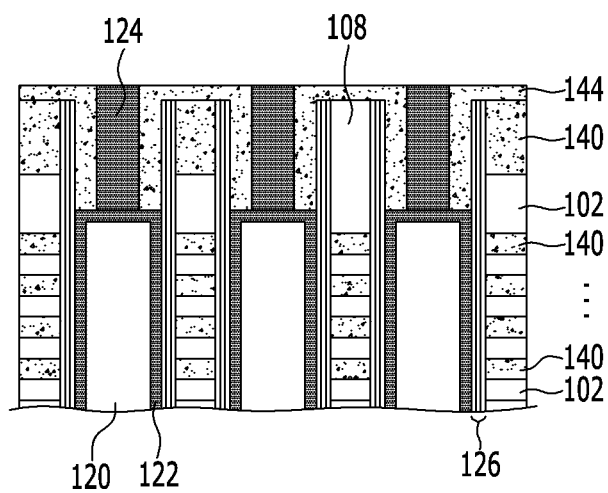

Referring to FIG. 10D, a second channel pillar 124 may be formed on the second channel layer 122B. The second channel pillar 124 may include a material substantially the same as that of the first channel pillar 122. Thus, the second channel pillar 124 may include a silicon layer. The second channel pillar 124 may be formed by forming a silicon layer on the entire surface of the structure to fill up the mold hole 150, and planarizing the silicon layer until an upper surface of the mold layer 144 may be exposed.

Thus, the second channel pillar 124 may be formed on the first channel pillar 122. The second channel pillar 124 may have a center line aligned with a center line of the first channel pillar 122 or the core pillar 120 in the third direction D3.

Figure 10E:
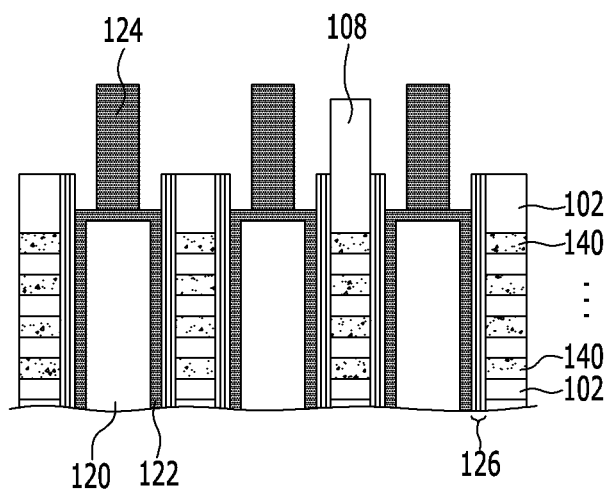

Referring to FIG. 10E, after removing the mold layer 144, the uppermost sacrificial layer 140 may then be removed. Because the mold layer 144 and the uppermost sacrificial layer 140 may include the same material, the mold layer 144 and the uppermost sacrificial layer 140 may be simultaneously removed by one etching process.

Further, the memory layer 126 on sidewalls of the mold layer 144 and the uppermost sacrificial layer 140 may also be removed together with the mold layer 144 and the uppermost sacrificial layer 140.

Figure 10F:
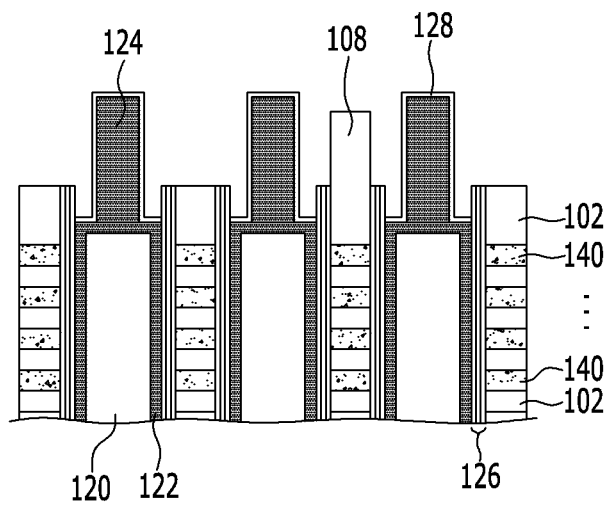

Referring to FIG. 10F, a gate insulation layer 128 may be formed on surfaces of the first channel pillar 122 and the second channel pillar 124 exposed by removing the mold layer 144 and the uppermost sacrificial layer 140. The gate insulation layer 128 may include an oxide layer. The gate insulation layer 128 may be formed by a deposition process, an oxidation process, etc. When the gate insulation layer 128 may be formed by the oxidation process, the gate insulation layer 128 may be selectively formed on only the surfaces of the first channel pillar 122 and the second channel pillar 124. In contrast, when the gate insulation layer 128 may be formed by the deposition process, the gate insulation layer 128 may be formed on the entire surface of the structure.

In various examples of embodiments, the method may include forming the gate insulation layer by the oxidation process. The oxidation process may include a thermal treatment process under an oxygen atmosphere, an oxygen radical process under plasma atmosphere, etc.

FIG. 6 may show the gate insulation layer 128 formed by the deposition process.

Figure 10G:
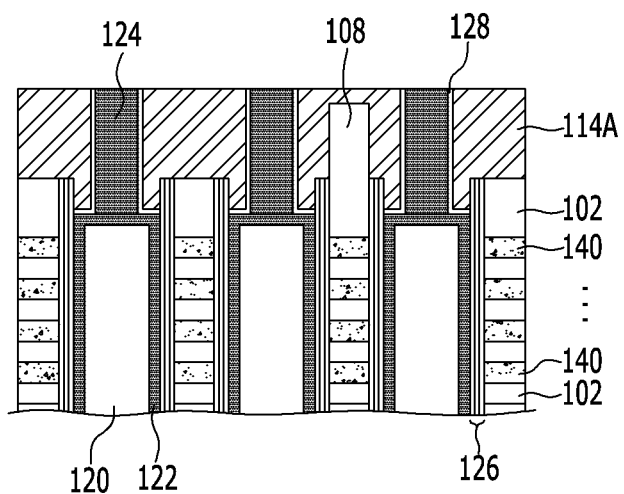

Referring to FIG. 10G, a conductive layer 114A may be formed in a space between the second channel pillars 124. The conductive layer 114A may be formed in a space between the second channel pillar 124 and the uppermost first insulating interlayer 102 as well as the space between the second channel pillars 124.

The conductive layer 114A may be formed by depositing the conductive layer 114A on an entire surface of a structure with the second channel pillar 124, and planarizing the conductive layer 114A until an upper surface of the second channel pillar 124 may be exposed. The gate insulation layer 128 may be partially exposed by the planarization process to expose the upper surface of the second channel pillar 124.

Figure 10H:
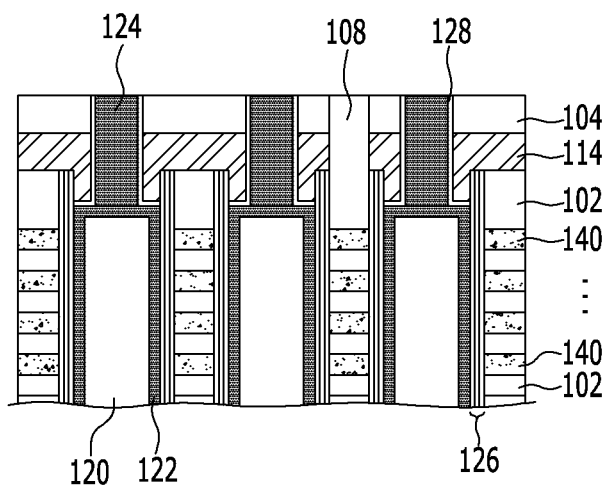

Referring to FIG. 10H, the conductive layer 114A may be etched-back until an upper surface of the conductive layer 114A may be positioned under the upper surface of the second channel pillar 124 to form third conductive patterns 114. The third conductive patterns 114 may be divided by the isolation layer 108. The third conductive patterns 114 may correspond to the drain selection lines DSL1 and DSL2 in FIG. 3.

A second insulating interlayer 104 may be formed on the third conductive patterns 114. The second insulating interlayer 104 may then be planarized. An upper end of the second channel pillar 124, which may be damaged by the etch-back process for forming the third conductive patterns 114, may also be removed by the planarization process. The upper surface of the second channel pillar 124, the upper surface of the second insulating interlayer 104 and the upper surface of the isolation layer 108 may be substantially coplanar with each other by the planarization process. The second insulating interlayer 104 may include an oxide layer.

Figure 10I:
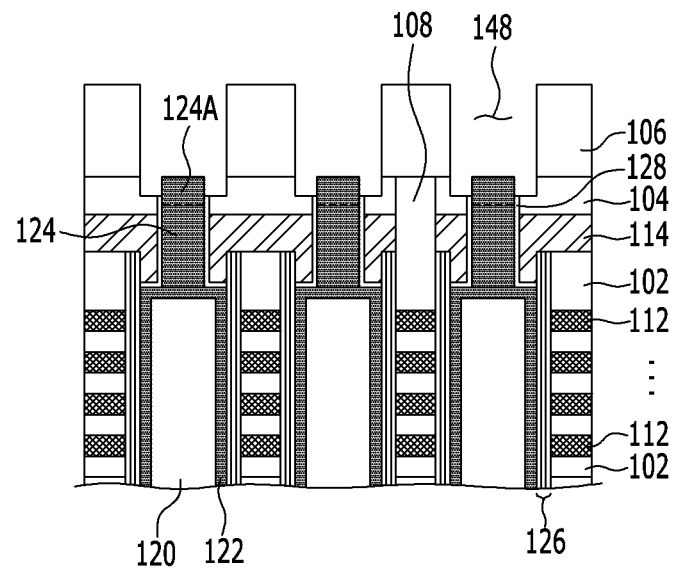

Referring to FIGS. 4 and 10I, the sacrificial layer 140 may then be removed by a process for forming the slit structures 130. A conductive material may be formed in a space formed by removing the sacrificial layer 140 to form a first conductive pattern 110 and second conductive patterns 112.

Therefore, a plurality of gate stacks GST divided by the slit structure 130 may be formed.

A third insulating interlayer 106 may be formed on the gate stacks GST and the slit structures 130. The third insulating interlayer 106 may include an oxide layer.

The third insulating interlayer 106 and the second insulating interlayer 104 may be etched using a hard mask pattern as an etch barrier to form a plurality of contact holes 148 configured to expose the upper end of the second channel pillar 124. The upper end of the second channel pillar 124 may be a shape inserted into the contact hole 148.

Impurities may be implanted into the upper end of the second channel pillar 124 exposed through the contact hole 148. The upper end of the second channel pillar 124 may then be thermally treated to form a junction region 124A. The impurities may include n type impurities. The junction region 124A may correspond to a drain of a drain selection transistor.

Figure 10J:
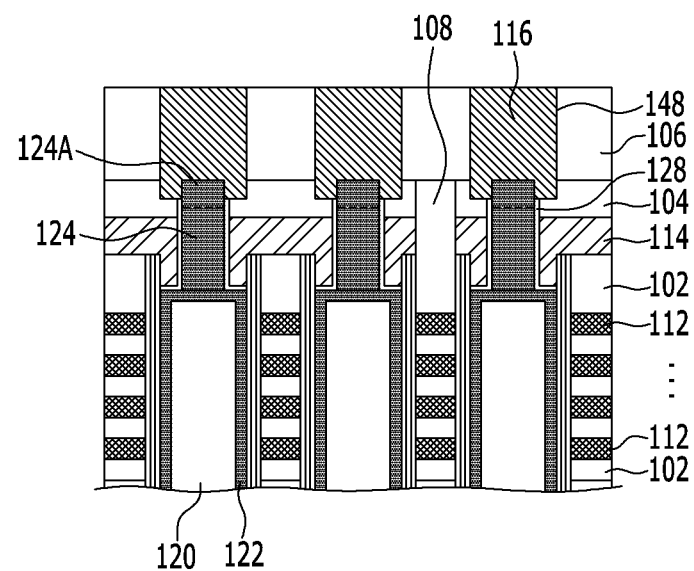

Referring to FIG. 10J, a plurality of contact plugs 116 may be formed in the contact holes 148. The contact plugs 116 may be configured to connect the second channel pillar 124 with the bit lines formed later.

The upper end of the second channel pillar 124 may be inserted into a lower end of the contact plug 116 to increase a contact area between the second channel pillar 124 and the contact plug 116, thereby reducing a contact resistance. Further, because the upper end of the second channel pillar 124 may be inserted into a lower end of the contact plug 116, a part of the isolation layer 108 configured to divide the third conductive patterns 114 may be positioned between the contact plugs 116.

Therefore, the memory cell array in FIG. 4 including the gate stacks GST, the slit structures 130, the channel structures CH and the contact plugs 116 may be formed. The slit structures 130 may be formed between the gate stacks GST. The channel structures CH may penetrate the gate stack GST. The contact plugs 116 may be formed on the gate stacks GST. The contact plugs 116 may be electrically connected with the channel structures CH.

According to various examples of embodiments, the second channel pillar 124 may be formed using the mold layer 144 with the mold hole 150. Thus, the first channel pillar 122 and the second channel pillar 124 may be readily aligned with each other so that characteristic deteriorations caused by a misalignment between the first and second channel pillars 122 and 124 may be fundamentally prevented.

FIGS. 11A to 11H are cross-sectional views illustrating a method of manufacturing a semiconductor memory device in accordance with various examples of embodiments. FIGS. 11A to 11H may show a method of manufacturing a memory cell array of the semiconductor memory device. The method of manufacturing the memory cell array may be included in step S3 in FIG. 8 or in step S13 in FIG. 9.

Figure 11A:
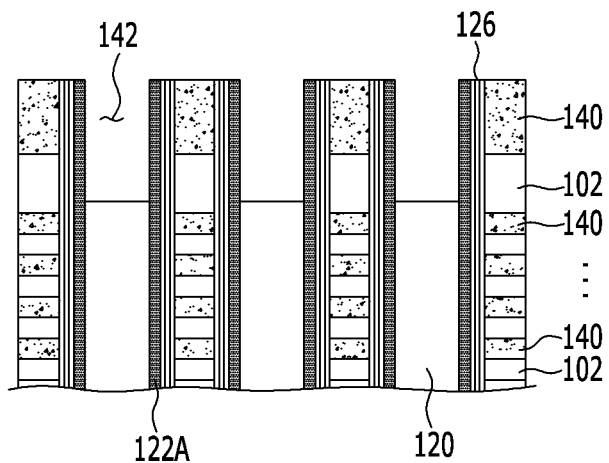
FIGS. 11A, 11B, 11C, 11D, 11E, 11F, 11G, and 11H are cross-sectional views illustrating a method of manufacturing a semiconductor memory device in accordance with various examples of embodiments.

Referring to FIG. 11A, a stack layer may be formed on a substrate with a structure. The stack layer may include a first insulating interlayer 102 and a sacrificial layer 140 alternately stacked. The sacrificial layer 140 may be positioned at an uppermost layer of the stack layer. The first insulating interlayer 102 corresponding to an uppermost layer of the first insulating interlayers 102 may have a thickness thicker than a thickness of the remaining first insulating interlayers 102. The sacrificial layer 140 corresponding to the uppermost layer of the sacrificial layers 140 may have a thickness thicker than a thickness of the remaining sacrificial layers 140. The first insulating interlayer 102 may include an oxide layer and the sacrificial layers 140 may include a nitride layer.

A plurality of channel holes 142 may be formed through the stack layer using a hard mask pattern.

A memory layer 126 may be formed on a surface of each of the channel holes 142. The memory layer 126 may include a blocking layer 126B, a charge-trapping layer 126C and a tunnel insulation layer 126T sequentially stacked. The blocking layer 126B and the tunnel insulation layer 126T may include an oxide layer and the charger-trapping layer 126C may include a nitride layer.

A first channel layer 122A may be formed on the memory layer 126. The first channel layer 122A on the surface of the channel hole 142 over the memory layer 126 may have a cylindrical shape. The first channel layer 122A may include a semiconductor layer. For example, the first channel layer 122A may include a silicon layer.

A core pillar 120 may be formed on the first channel layer 122A to fully fill the channel hole 142 with the core pillar 120. The core pillar 120 may include an oxide layer.

A recess etch process may be performed on the core pillar 120 on an upper end of the channel hole 142 to reduce a height of the core pillar 120. An etched depth of the recess etch process may be substantially equal to or less than a sum of the thickness of the uppermost first insulating interlayer 102 and the thickness of the uppermost sacrificial layer 140.

Figure 11B:
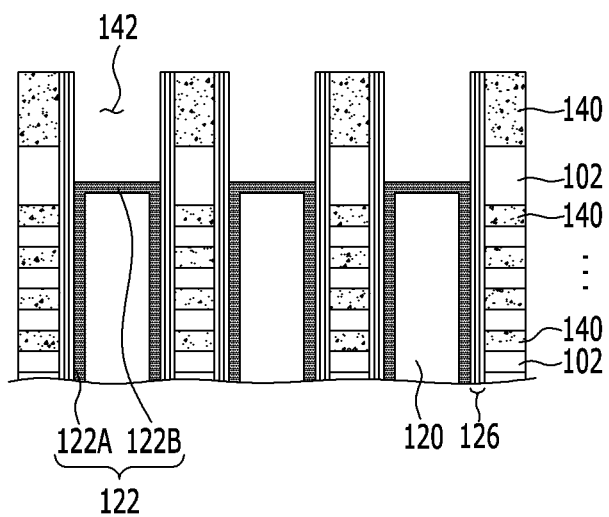

Referring to FIG. 11B, a second channel layer 122B may be formed on the core pillar 120 to cover an end of the first channel layer 122A. The second channel layer 122B may include a material substantially the same as that of the first channel layer 122A. For example, the second channel layer 122B may include a silicon layer. The second channel layer 122B may be formed by forming a silicon layer in the channel hole 142, and by performing a recess etching process on the silicon layer to reduce a thickness of the silicon layer in the channel hole 142. Thus, the second channel layer 122B may have a plate shape having a planar shape corresponding to a planar shape of the channel hole 142.

Therefore, a first channel pillar 122 including the first channel layer 122A and the second channel layer 122B may be formed. The first channel layer 122A may be configured to surround a side surface and a bottom surface of the core pillar 120. The second channel layer 122B may be configured to cover an upper surface of the first channel layer 122A.

After forming the first channel pillar 122, a memory layer 126 exposed through an upper end of the channel hole 142 may be etched.

Figure 11C:
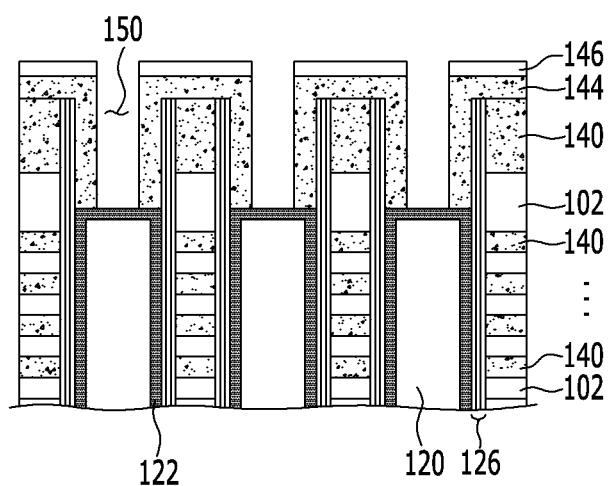

Referring to FIG. 11C, a mold layer 144 may be formed on upper surface of a structure with the first channel pillar 122. The mold layer 144 may include a material substantially the same as that of the sacrificial layer 140. For example, the mold layer 144 may include a nitride layer.

A hard mask may then be formed on the mold layer 144. The mold layer 144 may be etched using the hard mask as an etch barrier to form a mold hole 150 configured to partially expose the second channel layer 122B. Because the mold layer 144 may be extended along a profile of the upper surface of the structure with the first channel pillar 122, the mold hole 150 may be self-aligned with the first channel pillar 122.

Figure 11D:
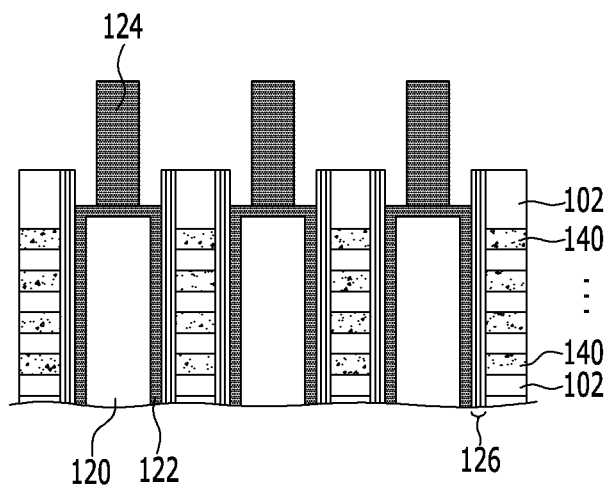

Referring to FIG. 11D, a second channel pillar 124 may be formed on the second channel layer 122B. The second channel pillar 124 may include a material substantially the same as that of the first channel pillar 122. Thus, the second channel pillar 124 may include a silicon layer. The second channel pillar 124 may be formed by forming a silicon layer on the entire surface of the structure to fill up the mold hole 150, and planarizing the silicon layer until an upper surface of the mold layer 144 may be exposed.

Thus, the second channel pillar 124 may be formed on the first channel pillar 122. The second channel pillar 124 may have a center line aligned with a center line of the first channel pillar 122 or the core pillar 120 in the third direction D3.

After removing the mold layer 144, the uppermost sacrificial layer 140 may then be removed. Because the mold layer 144 and the uppermost sacrificial layer 140 may include the same material, the mold layer 144 and the uppermost sacrificial layer 140 may be simultaneously removed by one etching process.

Further, the memory layer 126 on sidewalls of the mold layer 144 and the uppermost sacrificial layer 140 may also be removed together with the mold layer 144 and the uppermost sacrificial layer 140.

Figure 11E:
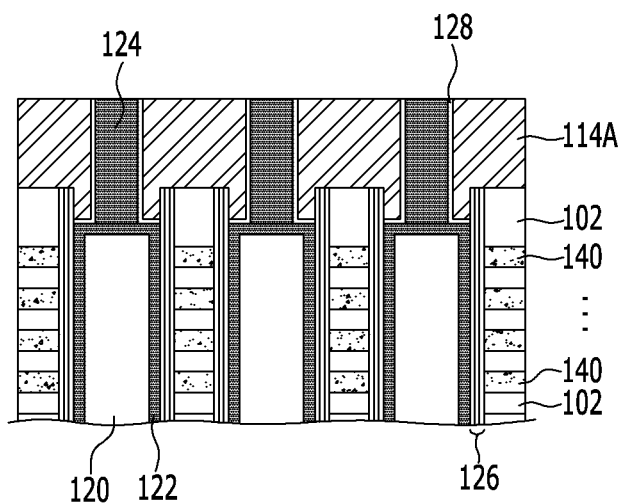

Referring to FIG. 11E, a gate insulation layer 128 may be formed on surfaces of the first channel pillar 122 and the second channel pillar 124 exposed by removing the mold layer 144 and the uppermost sacrificial layer 140. The gate insulation layer 128 may include an oxide layer. The gate insulation layer 128 may be formed by a deposition process, an oxidation process, etc. When the gate insulation layer 128 may be formed by the oxidation process, the gate insulation layer 128 may be selectively formed on only the surfaces of the first channel pillar 122 and the second channel pillar 124. In contrast, when the gate insulation layer 128 may be formed by the deposition process, the gate insulation layer 128 may be formed on the entire surface of the structure.

In various examples of embodiments, the method may include forming the gate insulation layer by the oxidation process. The oxidation process may include a thermal treatment process under an oxygen atmosphere, an oxygen radical process under plasma atmosphere, etc.

FIG. 6 may show the gate insulation layer 128 formed by the deposition process.

A conductive layer 114A may be formed in a space between the second channel pillars 124. The conductive layer 114A may be formed in a space between the second channel pillar 124 and the uppermost first insulating interlayer 102 as well as the space between the second channel pillars 124.

The conductive layer 114A may be formed by depositing the conductive layer 114A on an entire surface of a structure with the second channel pillar 124, and planarizing the conductive layer 114A until an upper surface of the second channel pillar 124 may be exposed. The gate insulation layer 128 may be partially exposed by the planarization process to expose the upper surface of the second channel pillar 124.

Figure 11F:
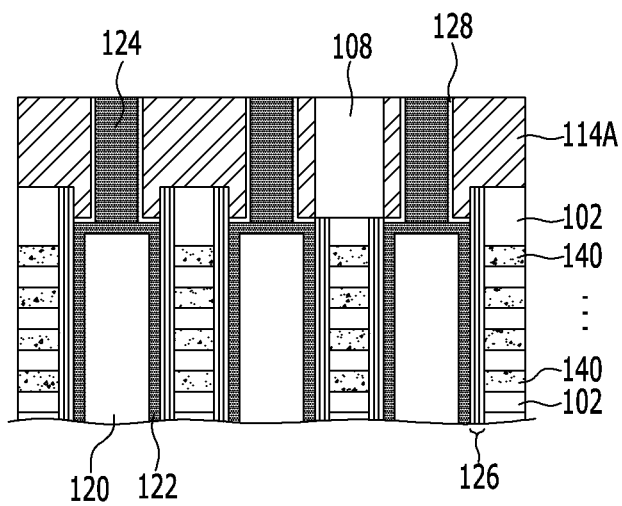

Referring to FIG. 11F, at least one isolation layer 108 may penetrate the conductive layer 114A. The isolation layer 108 may correspond to the first slit S1 in FIG. 3. The isolation layer 108 may include an insulation layer. For example, the isolation layer 108 may include an oxide layer. The isolation layer 108 may be formed by etching the conductive layer 114A using a hard mask pattern as an etch barrier to form a trench, and forming an oxide layer in the trench. The first insulating interlayer 102 and the memory layer 126 may be partially etched by the process for forming the trench.

Figure 11G:
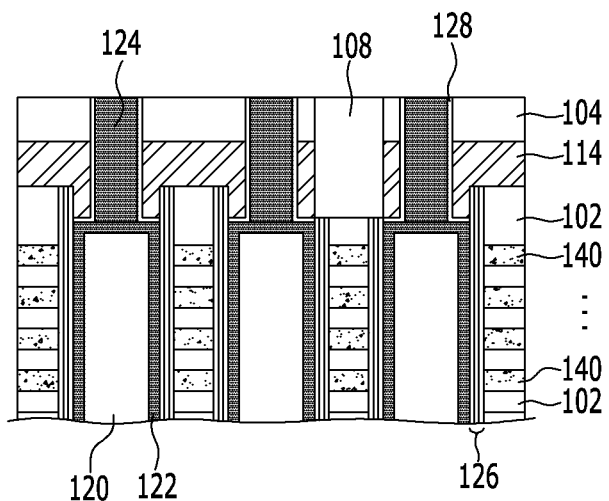

Referring to FIG. 11G, the conductive layer 114A may be etched-back until an upper surface of the conductive layer 114A may be positioned under the upper surface of the second channel pillar 124 to form third conductive patterns 114. The third conductive patterns 114 may be divided by the isolation layer 108. The third conductive patterns 114 may correspond to the drain selection lines DSL1 and DSL2 in FIG. 3.

A second insulating interlayer 104 may be formed on the third conductive patterns 114. The second insulating interlayer 104 may then be planarized. An upper end of the second channel pillar 124, which may be damaged by the etch-back process for forming the third conductive patterns 114, may also be removed by the planarization process. The upper surface of the second channel pillar 124, the upper surface of the second insulating interlayer 104 and the upper surface of the isolation layer 108 may be substantially coplanar with each other by the planarization process. The second insulating interlayer 104 may include an oxide layer.

Figure 11H:
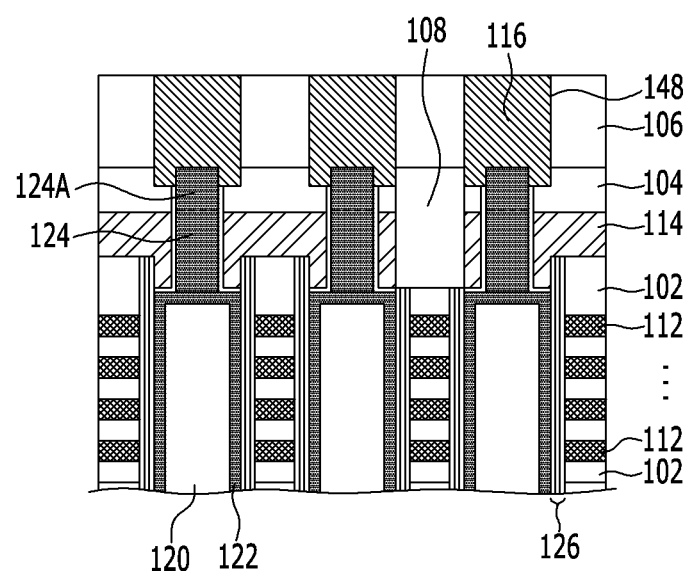

Referring to FIG. 11H, the sacrificial layer 140 may then be removed by a process for forming the slit structures 130. A conductive material may be formed in a space formed by removing the sacrificial layer 140 to form a first conductive pattern 110 and second conductive patterns 112.

Therefore, a plurality of gate stacks GST divided by the slit structure 130 may be formed.

A third insulating interlayer 106 may be formed on the gate stacks GST and the slit structures 130. The third insulating interlayer 106 may include an oxide layer.

The third insulating interlayer 106 and the second insulating interlayer 104 may be etched using a hard mask pattern as an etch barrier to form a plurality of contact holes 148 configured to expose the upper end of the second channel pillar 124. The upper end of the second channel pillar 124 may be a shape inserted into the contact hole 148.

Impurities may be implanted into the upper end of the second channel pillar 124 exposed through the contact hole 148. The upper end of the second channel pillar 124 may then be thermally treated to form a junction region 124A. The impurities may include n type impurities. The junction region 124A may correspond to a drain of a drain selection transistor.

A plurality of contact plugs 116 may be formed in the contact holes 148. The contact plugs 116 may be configured to connect the second channel pillar 124 with the bit lines formed later.

The upper end of the second channel pillar 124 may be inserted into a lower end of the contact plug 116 to increase a contact area between the second channel pillar 124 and the contact plug 116, thereby reducing a contact resistance. Further, because the upper end of the second channel pillar 124 may be inserted into a lower end of the contact plug 116, a part of the isolation layer 108 configured to divide the third conductive patterns 114 may be positioned between the contact plugs 116.

Therefore, the memory cell array in FIG. 4 including the gate stacks GST, the slit structures 130, the channel structures CH and the contact plugs 116 may be formed. The slit structures 130 may be formed between the gate stacks GST. The channel structures CH may penetrate the gate stack GST. The contact plugs 116 may be formed on the gate stacks GST. The contact plugs 116 may be electrically connected with the channel structures CH.

The semiconductor memory device may be completed by well-known processes.

According to various examples of embodiments, the second channel pillar 124 may be formed using the mold layer 144 with the mold hole 150. Thus, the first channel pillar 122 and the second channel pillar 124 may be readily aligned with each other so that characteristic deteriorations caused by a misalignment between the first and second channel pillars 122 and 124 may be fundamentally prevented.

Figure 12:
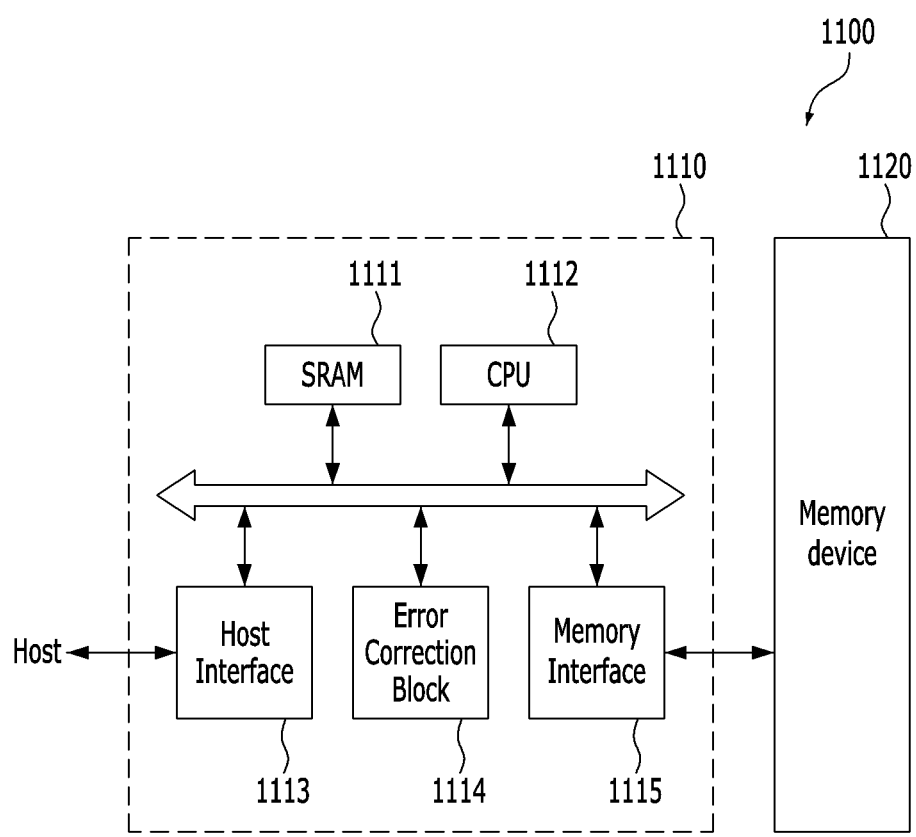
FIG. 12 is a block diagram illustrating a memory system in accordance with various examples of embodiments.

FIG. 12 is a block diagram illustrating a memory system in accordance with various examples of embodiments.

Referring to FIG. 12, a memory system 1100 may include a memory device 1120 and a memory controller 1110.

The memory device 1120 may include gate stacks, channel structures and contact plugs. The gate stacks may include a plurality of stacked conductive patterns spaced apart from each other. The channel structures may penetrate the gate stack. The contact plugs may be formed on the gate stacks. The contact plugs may be overlapped with the channel structures. Each of the channel structures may include a first channel pillar, a memory layer, a second channel pillar and a gate insulation layer. The first channel pillar may penetrate a part of the gate stack. The memory layer may be configured to surround a bottom surface and a side surface of the first channel pillar. The second channel pillar may be extended from an upper surface of the first channel pillar to penetrate remaining gate stacks. The second channel pillar may be connected to the contact plugs. The gate insulation layer may be configured to surround a side surface of the second channel pillar. The memory device 1120 may include the second channel pillar to effectively improve an integration degree of the memory device 1120. Further, a drain selection transistor using the second channel pillar may have improved operational reliability.

The memory device 1120 may include a multi-chip package including a plurality of flash memory chips.

The memory controller 1110 may be configured to control the memory device 1120. The memory controller 1110 may include a static random access memory (SRAM) 1111, a central processing unit (CPU) 1112, a host interface 1113, an error correction block 1114 and a memory interface 1115. The SRAM 1111 may be used for an operation memory of the CPU 1112. The CPU 1112 may be configured to perform control operations including data exchange of the memory controller 1110. The host interface 1113 may include a data exchange protocol of a host coupled to the memory system 1100. The error correction block 1114 may be configured to detect and correct errors in data read from the memory device 1120. The memory interface 1115 may be interfaced with the memory device 1120. The memory controller 1110 may further include a read only memory (ROM) configured to store code data interfaced with the host.

Figure 13:
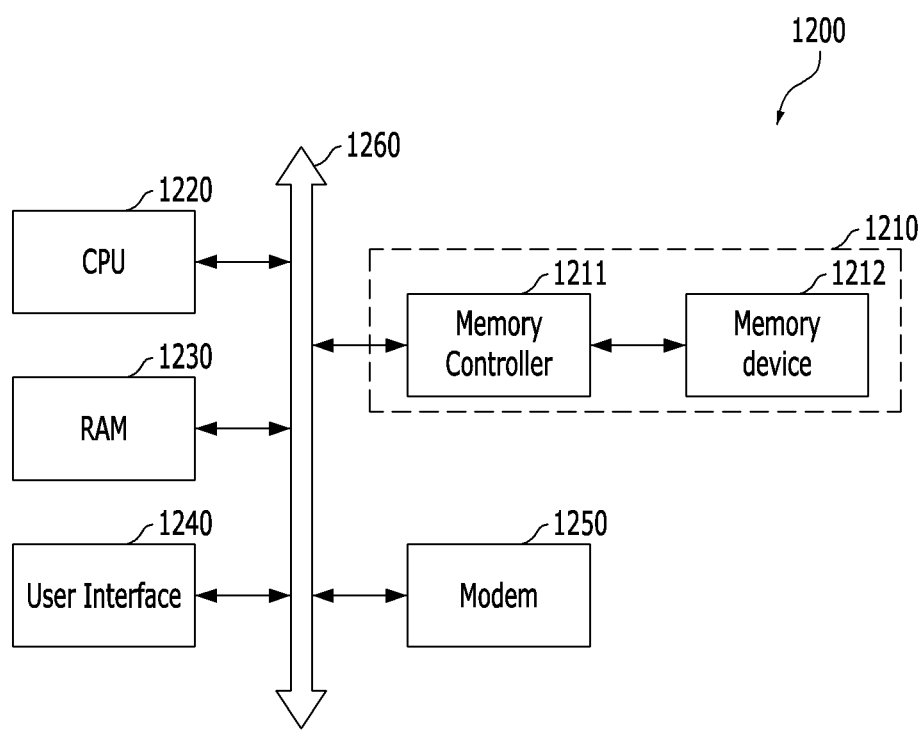
FIG. 13 is a block diagram illustrating a computing system in accordance with various examples of embodiments.

FIG. 13 is a block diagram illustrating a computing system in accordance with various examples of embodiments.

Referring to FIG. 13, a computing system 1200 may include a CPU 1220, a RAM 1230, a user interface 1240, a modem 1250 and a memory system 1210. The computing system 1200 may include a mobile device.

The memory system 1210 may include a memory device 1212 and a memory controller 1211. The memory device 1210 may include gate stacks, channel structures and contact plugs. The gate stacks may include a plurality of stacked conductive patterns spaced apart from each other. The channel structures may penetrate the gate stack. The contact plugs may be formed on the gate stacks. The contact plugs may be overlapped with the channel structures. Each of the channel structures may include a first channel pillar, a memory layer, a second channel pillar and a gate insulation layer. The first channel pillar may penetrate a part of the gate stack. The memory layer may be configured to surround a bottom surface and a side surface of the first channel pillar. The second channel pillar may be extended from an upper surface of the first channel pillar to penetrate remaining gate stacks. The second channel pillar may be connected to the contact plugs. The gate insulation layer may be configured to surround a side surface of the second channel pillar. The memory device 1210 may include the second channel pillar to effectively improve an integration degree of the memory device 1210. Further, a drain selection transistor using the second channel pillar may have improved operational reliability.

The above described embodiments are intended to illustrate and not to limit the present disclosure. Various alternatives and equivalents are possible. The embodiments are not limited by the embodiments described herein. Nor are the embodiments limited to any specific type of semiconductor device. Another additions, subtractions, or modifications are obvious in view of the present disclosure and are intended to fall within the scope of the appended claims.

What is claimed is:

1. A method of manufacturing a semiconductor memory device, the method comprising:
   forming a stack layer including sacrificial layers and first insulating interlayers that are alternately stacked, the sacrificial layer positioned at an uppermost layer of the stack layer;
   forming a channel holes through the stack layer;
   forming a first channel pillar in the channel holes;
   forming a mold layer on the stack layer with the first channel pillar;
   etching the mold layer to open a center portion of the first channel pillar, to form a mold hole, wherein an edge portion of the first channel pillar is covered by the mold layer;
   forming a second channel pillar in the mold hole; and
   removing the mold layer and the uppermost sacrificial layer, to expose a sidewall of the second channel pillar, an upper surface of the second channel pillar, and an upper surface of the first channel pillar located outside the second channel pillar.

2. The method of claim 1, wherein forming the first channel pillar comprises:
   forming a memory layer on a surface of the channel hole;
   forming a first channel layer on the memory layer;
   forming a core pillar on the first channel layer to partially fill the channel hole; and
   forming a second channel layer on the core pillar to contact an end of the first channel layer.

3. The method of claim 1, wherein forming the mold layer with the mold hole comprises self-aligning a center line of the second channel pillar in a vertical direction with a center line of the first channel pillar in the vertical direction.

4. The method of claim 1, wherein the mold layer comprises a material the same as a material of the sacrificial layer.

5. The method of claim 1, wherein the second channel pillar has a diameter less than a diameter of the first channel pillar.

6. The method of claim 1, further comprising:
   forming a gate insulation layer on the sidewall of the second channel pillar, the upper surface of the second channel pillar, and the upper surface;

forming a conductive layer with a thickness lower than a height of the second channel pillar on both sides of the second channel pillar; and forming a second insulating interlayer on the conductive layer.

7. The method of claim 6, further comprising forming at least one isolation layer configured to penetrate the second insulating interlayer and the conductive layer, wherein the conductive layer is divided into at least two conductive patterns spaced apart from each other by the isolation layer.

8. The method of claim 6, further comprising forming at least one isolation layer configured to penetrate the uppermost sacrificial layer and an uppermost first insulating interlayer before forming the channel hole.

9. The method of claim 6, wherein forming the conductive layer with the thickness lower than a height of the second channel pillar comprises:

etching-back the conductive layer to expose the gate insulation layer located on the sidewall of the second channel pillar.

10. The method of claim 6, further comprising:

forming a third insulating interlayer on the second insulating interlayer;

selectively etching the third insulating interlayer and the second insulating interlayer to form a contact hole configured to expose the second channel pillar; and forming a contact plug in the contact hole.

11. The method of claim 10, further comprising implanting impurities into the second channel pillar exposed through the contact hole to form a junction region, before forming the contact plug in the contact hole.

12. The method of claim 10, wherein an upper surface of the second channel pillar and an upper sidewall of the second channel pillar are inserted into a lower surface of the contact plug.

* * * * *